United States Patent [19]

Maeda

[11] Patent Number: 5,426,333
[45] Date of Patent: Jun. 20, 1995

[54] BOOSTING CIRCUIT DEVICE CAPABLE OF PRE-PUMPING AND SEMICONDUCTOR MEMORY DEVICE

[75] Inventor: Toshio Maeda, Kodaira, Japan

[73] Assignees: Hitachi, Ltd., Tokyo; Hitachi Device Engineering Co., Ltd., Chiba, both of Japan

[21] Appl. No.: 231,126

[22] Filed: Apr. 22, 1994

[30] Foreign Application Priority Data

Apr. 26, 1993 [JP] Japan .................. 5-121955

[51] Int. Cl.⁶ .................. H03K 3/02; H03K 3/033
[52] U.S. Cl. .................. 327/536; 365/203; 327/546; 327/589
[58] Field of Search .................. 307/264, 296.2, 296.4, 307/296.6, 273; 365/203

[56] References Cited

U.S. PATENT DOCUMENTS 3,333,205 10/1964 Featherston .................. 307/273
4,670,668 6/1987 Liu .................. 307/296.2
4,794,278 12/1988 Vajdic .................. 307/296.2

Primary Examiner—Timothy P. Callahan
Assistant Examiner—Jung Ho Kim
Attorney, Agent, or Firm—Antonelli, Terry, Stout & Kraus

[57] ABSTRACT

A dynamic random access memory in which data are successively read out responsive to a read command signal is provided with a boosting circuit device. The boosting circuit device has a pumping circuit operable with a first electric power source at a first voltage and responsive to a control clock signal for producing a second electric power at a second voltage boosted higher than the first voltage of the first electric power. A one-shot pulse generator is provided for generating a single pulse from which a pre-pumping pulse is produced to be included in the control clock signal. Thus, the control clock signal contains a pre-pumping pulse and a plurality of clock pulses following the pre-pumping pulse, so that the second voltage of the second electric power has been boosted higher than the first voltage of the first electric power by the pre-pumping pulse in advance of a successive readout of data.

5 Claims, 11 Drawing Sheets

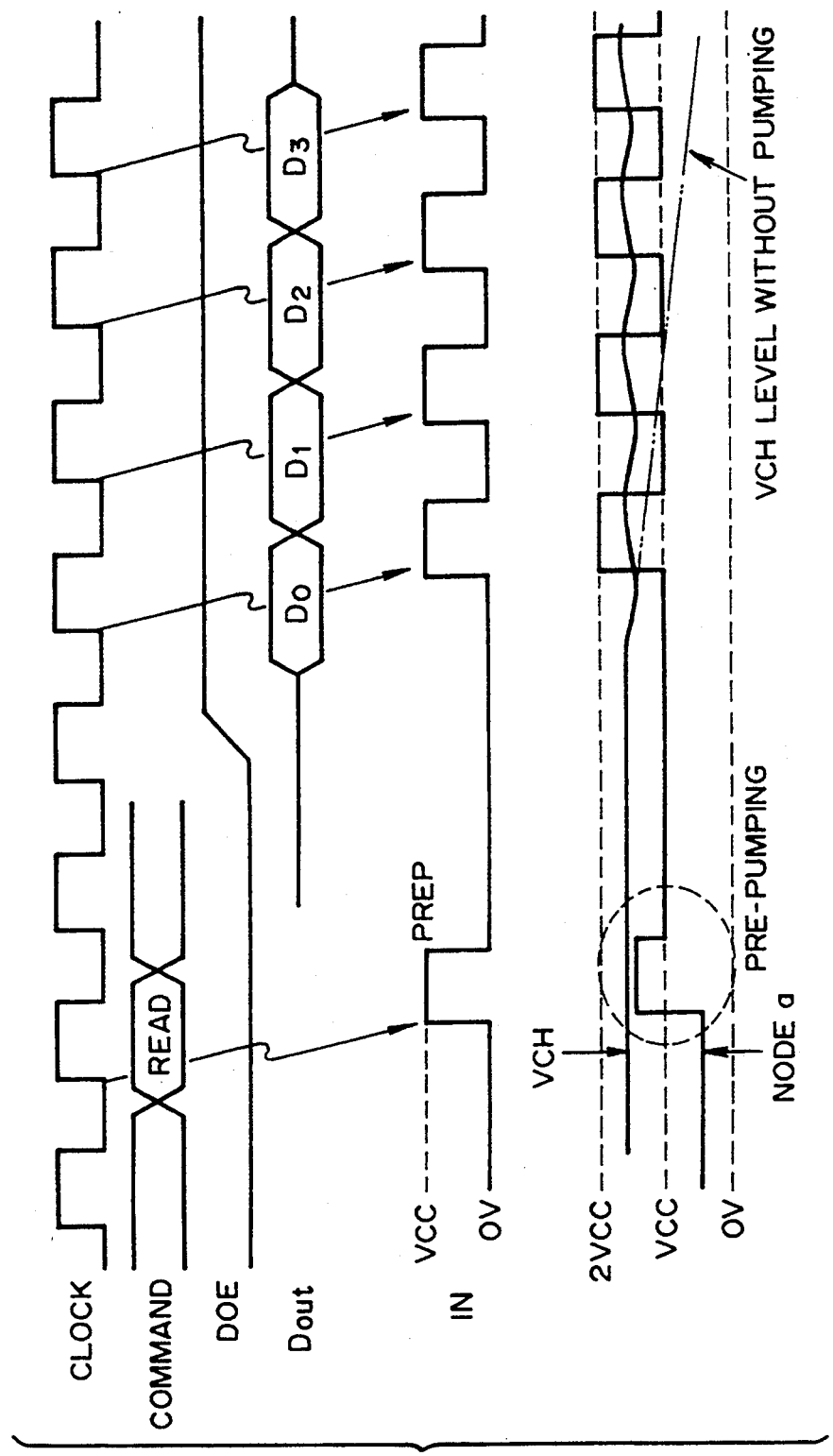

BOOSTING CIRCUIT DEVICE CAPABLE OF PRE-PUMPING AND SEMICONDUCTOR MEMORY DEVICE

BACKGROUND OF THE INVENTION

The present invention relates to semiconductor memory devices and more particularly to a technique effective for use, for example, with a SDRAM (Synchronous Dynamic Random Access Memory) and a VRAM (Video Random Access Memory) which have a successive or continuous reading function performed through an output circuit driven with a boosted voltage.

A DRAM (Dynamic Random Access Memory) of the type which uses a word line select signal generated with a boosted voltage is known in which the boosted voltage is generated by a boosting circuit. A DRAM provided with such a boosting circuit is disclosed, for example, in JP-A-3-214669 laid-open on Sep. 19, 1991.

SUMMARY OF THE INVENTION

In order to operate a SDRAM or a VRAM with the function of reading data of bits successively at an increased speed with a relatively small occupation area, the inventors have considered that a driver section which drives an output section (including two N-channel MOSFETs in a push-pull connection) of the data output circuit should be operated with a boosted voltage to feed to the output section a drive signal of a voltage higher than the power supply voltage to prevent a decrease in the level of the output signal due to a threshold voltage of the MOSFET connected on the power supply voltage side.

Meanwhile, the inventors have found that when a first one of the serial output data is delivered, a boosted voltage supplied to the output section of the data output circuit is not sufficient to thereby cause a delay in the access and an insufficient output voltage, in a case where a plurality of MOSFETs performing a charge pump operation is driven with a bootstrap voltage for switching operations in an effort to enhance the operation efficiency of the charge pump circuits which constitute the boosting circuit device for generating the boosted voltage. In order to solve such problem, it could be conceived to generate a boosted voltage with a continuously generated oscillation pulse signal, which would however disadvantageously cause an increase in the current consumption.

Especially, with a semiconductor memory device operated with a relatively low voltage of about 3 volts, a level margin in the data output circuit is small and, unless the data output circuit is driven with the boosted voltage, a sufficient output level cannot be obtained. If a pumping operation is performed by the MOSFETs of diode connection in the boosting circuit device, a required boosted voltage cannot be obtained due to a level loss caused by the threshold voltage of the MOSFETs. Thus, the pumping circuit used in the boosting circuit device is required to use a bootstrap circuit to control the switching operation of the MOSFETs to thereby perform the pumping operation. With the use of such bootstrap circuit, no boosted voltage is available with the first pumping operation cycle and hence no substantial boosting operation is performed.

It is an object of the present invention to provide a boosting circuit device capable of performing a pre-pumping operation.

It is another object of the present invention to provide a semiconductor memory device which reduces its power consumption, provides an increased output operation speed and prevents a deterioration in the output level.

It is still another object of the present invention to provide a simple-structured semiconductor memory device which reduces its power consumption, provides an increased-speed output operation and prevents a deterioration in the output level.

The above and other objects and novel features of the present invention will be clarified when the description in the specification is taken in conjunction with the accompanying drawings.

According to one aspect of the present invention, a boosting circuit device includes: pumping circuit means operable with a first electric power at a first voltage and responsive to a control clock signal for supplying a second electric power at a second voltage boosted higher than the first voltage of the first electric power; a one-shot pulse generator responsive to a preliminary input signal for generating a single pulse; and a control circuit responsive to the single pulse and an input clock signal for generating the control clock signal, wherein the preliminary input signal is generated in synchronization with the input clock signal and the control clock signal contains a pre-pumping pulse corresponding to the single pulse and a plurality of clock pulses corresponding to the input clock signal and following the pre-pumping pulse.

According to another aspect of the present invention, a data output circuit includes two N-channel MOSFETs arranged in a push-pull connection to output read data successively or continuously, and a boosting circuit device for generating a boosted voltage to be supplied to the data output circuit includes two switching MOSFETs the switching operation of which is controlled synchronously with an input pulse signal to the MOSFETs to perform the pumping operation in a pumping circuit in which control signals fed to the gates of the MOSFETs are boosted due to the bootstrap operation. A pre-pumping operation is performed in the pumping circuit prior to a data reading operation.

Since the pumping circuit generates a desired boosted voltage owing to its pre-pumping operation, the data output circuit is operated advantageously with a predetermined boosted voltage when the actual read operation starts.

BRIEF DESCRIPTION OF THE DRAWINGS

FIG. 3 is a timing chart illustrative of the basic operation of a boosting circuit device according to one embodiment of the present invention.

DESCRIPTION OF THE PREFERRED EMBODIMENTS

Figure 1:
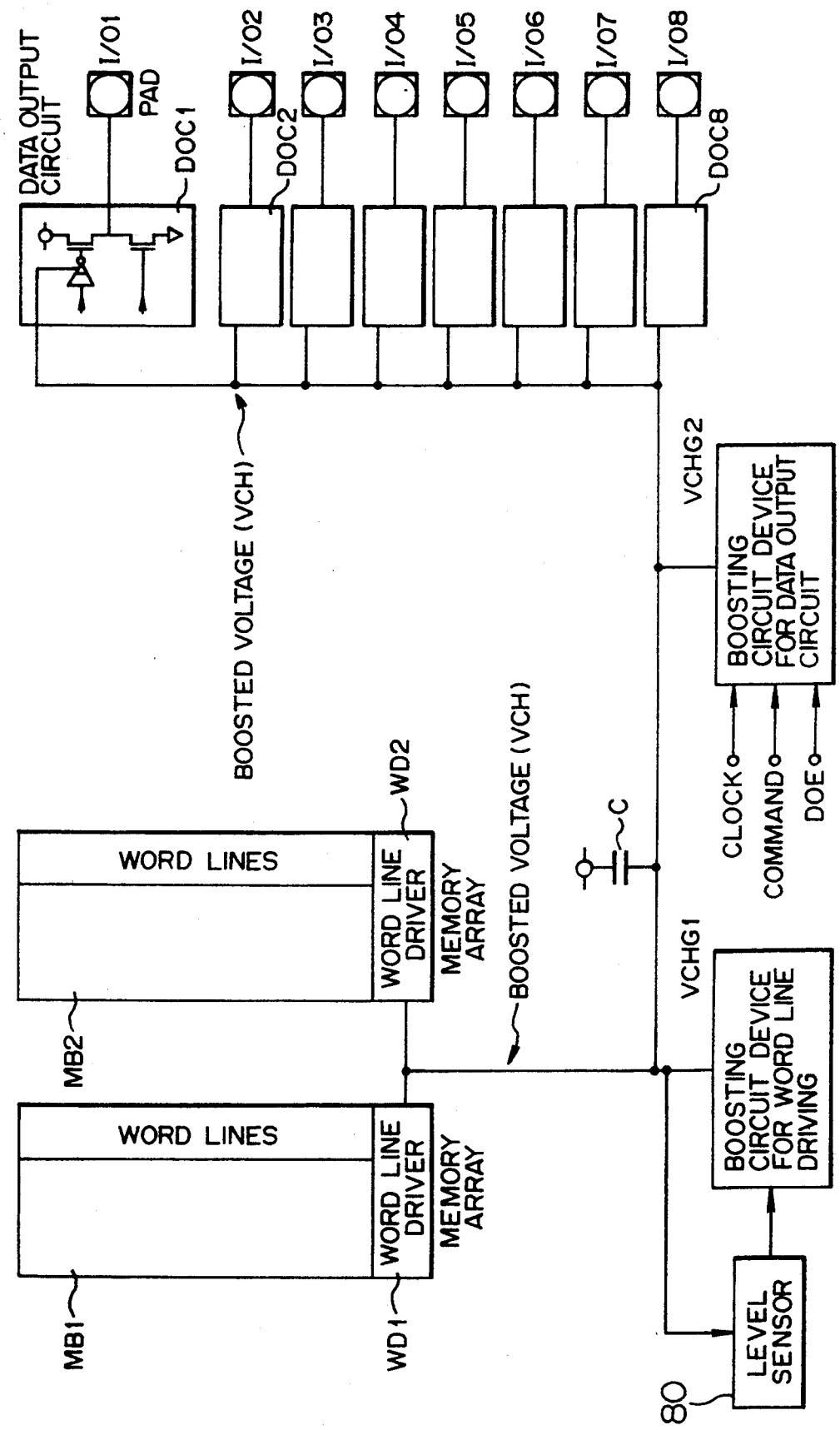
FIG. 1 is a schematic of the essential portion of a DRAM according to one embodiment of the present invention.

FIG. 1 is a schematic of the essential portion of a DRAM according to one embodiment of the present invention. The respective circuit elements shown in FIG. 1 are formed along with other circuit elements of the DRAM on a single semiconductor substrate, for example, of single crystal silicon, using well-known semiconductor integration circuit manufacturing techniques.

This embodiment is provided with two boosting circuit devices VCHG1 and VCHG2. One boosting circuit device VCHG1 is used to drive word lines of memory arrays MB1 and MB2. To this end, it generates a boosted voltage VCH fed to word line drivers WD1 and WD2 of the corresponding memory arrays. The other boosting circuit device VCHG2 generates a boosted voltage VCH fed to data output circuits DOC1–DOC8.

The boosting circuit devices VCHG1 and VCHG2 generate same boosted voltage VCH and share a relatively large smoothing capacitor C to increase the degree of integration. The capacitor C has a relatively large capacity of several hundreds of picofarads to several nanofarads. For example, it has a capacity of 960 picofarads when the DRAM has a storage capacity of 16 Mbits. Since the capacitor C occupies a relatively large area on the semiconductor substrate, the shared structure mentioned above reduces the chip area advantageously.

The DRAM of the present embodiment is provided with eight data output circuits such that they perform a data reading operation in the unit of 8 bits through input/output terminals (bonding pads) I/O1–I/O8, although not especially limited thereto.

Figure 2A:
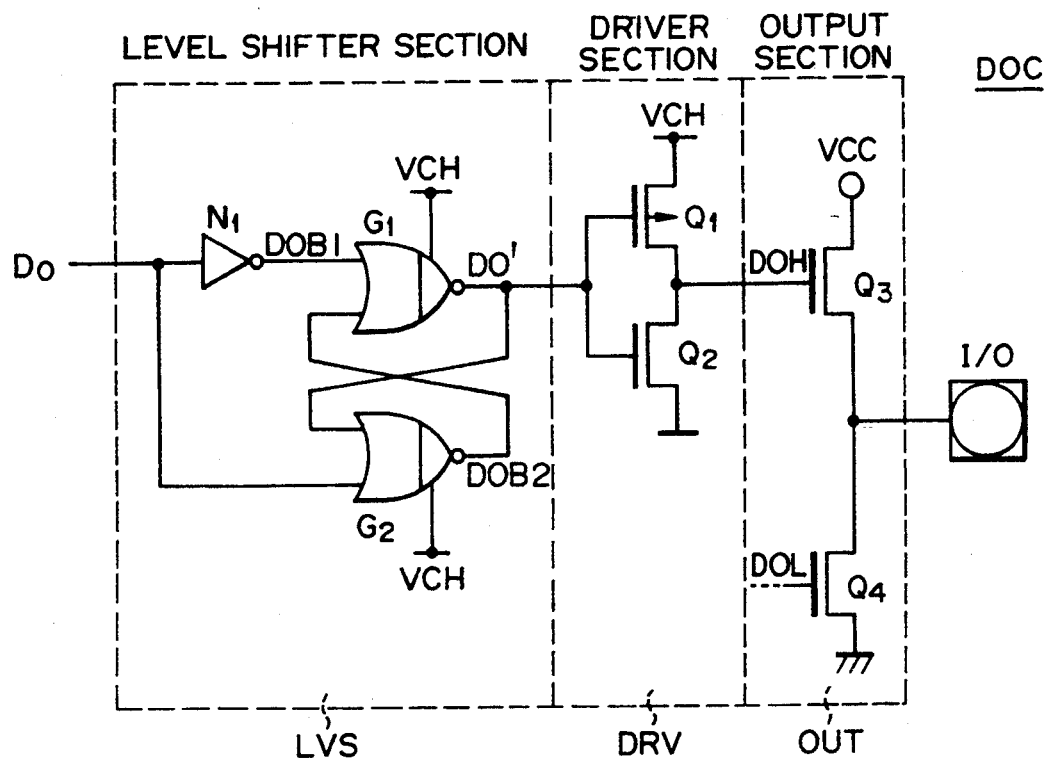
FIGS. 2A, 2B are diagrams of the essential portion of a data output circuit to which one embodiment of the present invention is applied.

The essential portion of each of the data output circuits DOC1–DOC8 may have a circuit configuration, as shown in FIG. 2A. The output section OUT of each data output circuit includes output N-channel MOSFETs Q3 and Q4 arranged in a push-pull connection. When data is outputted, the switching operations of the MOSFETs Q3 and Q4 are controlled in a complementary manner to provide low and high level output signals to the corresponding input/output terminal I/O. When the DRAM is either in a standby state or in a write state, the output MOSFETs Q3 and Q4 of the data output section OUT are both turned off to provide a high impedance state.

When the output MOSFET Q3 on the power supply voltage VCC side is turned on in response to a high level drive voltage fed to the gate of the MOSFET Q3 to provide a high level signal such as the power supply voltage VCC, the output level of the output section OUT would be lowered by an effective threshold voltage of the output MOSFET Q3. When the power supply voltage VCC is a relatively low voltage such as 3.3 volts, a required signal amplitude would not be available.

In this embodiment, the driver section DRV which drives the high-level side output MOSFET Q3 includes a CMOS inverter including two P- and N-channel MOSFETs Q1 and Q2 and using an operating voltage such as the boosted voltage VCH (VCH>VCC), which causes a high level of the output voltage D0H of the driving section DRV to be a voltage higher than the power supply voltage VCC as is the boosted voltage VCH. The boosted voltage VCH is determined to be higher by the effective threshold voltage Vth of the output MOSFET Q3 or more than the power supply voltage VCC. Thus, when the output voltage D0H of the driver section DRV is at a high level such as VCH in a reading operation, no level loss such as mentioned above is caused and an output voltage corresponding to the power supply voltage VCC is available from the source side of the MOSFET Q3.

The read signal D0 read from the memory arrays MB through a main amplifier (not shown) has either a high level such as the power supply voltage VCC or a low level such as the circuit grounding voltage, for example. Thus, in order to turn off and on the P- and N-channel MOSFETs Q1 and Q2, respectively, of the CMOS inverter of the driver section DRV with the high level of the signal D0, in other words, in order to operate the CMOS inverter in a complementary manner, the following level shifter section LVS is provided on the input side of the driver section DRV.

The level shifter section LVS includes two NOR gate circuits G1 and G2 adapted to operate with the boosted voltage VCH. One input terminal and an output terminal of each of the two NOR gate circuits G1 and G2 are cross-coupled to each other to form a latch.

Figure 2B:
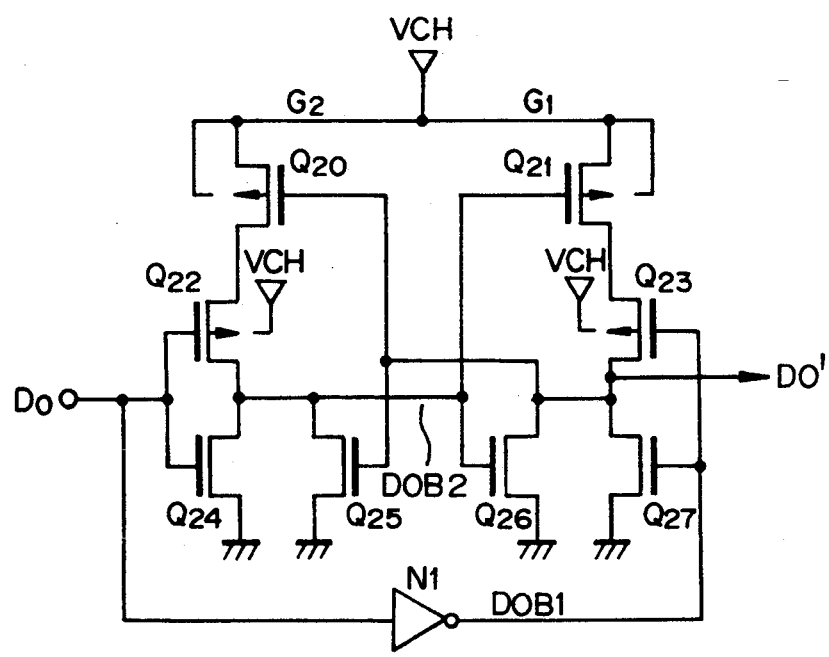

As shown in FIG. 2B, these NOR gate circuits G1 and G2 are comprised of two series-connected P-channel MOSFETs Q21, Q23 and Q20, Q22 and two parallel-connected N-channel MOSFETs Q26, Q27 and Q24, Q25. In the NOR gate circuit G1, among the two P-channel MOSFETs and two N-channel MOSFETs, the P-channel MOSFET Q21 and the N-channel MOSFET Q26 have their gates connected in common to form one input terminal for receiving an output signal D0B2 from the NOR gate circuit G2, while the other P-channel MOSFET Q23 and the other N-channel MOSFET Q27 have their gates connected in common to form the other input terminal for receiving an output signal D0B1 from an inverter circuit N1. The junction between the P-channel MOSFET Q23 and the other N-channel MOSFET Q27 is connected to an output terminal of the NOR gate circuit G1, from which an output signal D0' of the level shifter section LVS is delivered.

As described above, a read signal D0 is inputted to the other input terminal of the NOR gate circuit G1 through a CMOS inverter circuit N1, which is operated with the power supply voltage VCC unlike the NOR gate circuits G1 and G2. The signal D0 is inputted directly to the other input terminal of the NOR gate circuit G2.

As mentioned above, the signals D0B1, D0 inputted to the other input terminals of the NOR gate circuits G1 and G2 have an amplitude swinging between a high level such as the power supply voltage VCC and a low level such as the circuit grounding voltage. When the signal D0 is at low level, the output signal D0B1 of the inverter circuit N1 is at high level and the output signal D0' of the NOR gate circuit G1 is at low level. Since both of the input terminals of the NOR gate circuit G2 are supplied with signal D0 at low level and output signal D0' at low level from the NOR gate circuit G1, respectively, the series-connected P-channel MOSFETs Q22 and Q20 are both turned on so that the output signal D0B2 from the NOR gate circuit G2 will be at high level such as the boosted voltage VCH.

With the output signal D0B1 of the inverter circuit N1 being at high level such as VCC and being applied to the gate of the P-channel MOSFET Q23 in the NOR gate circuit G1, the MOSFET Q23 tends to be turned on owing to a voltage VCH-VCC applied between its gate and source. However, since the P-channel MOSFET Q21 receiving at its gate an output signal D0B2 at high level corresponding to the boosted voltage VCH is turned off, the current path of the series-connected P-channel MOSFETs Q21, Q23 in the NOR gate circuit G1 is cut off.

When the read signal D0 is changed to be at high level from low level, the output signal D0B1 of the inverter circuit N1 is changed to be at low level, and the output signal D0B2 of the NOR gate circuit G2 is changed to be at low level from high level. As a result, since the NOR gate circuit G1 receives at their two input terminals output signal D0B1 at low level from the inverter circuit N1 and output signal D0B2 at low level from the NOR gate circuit G2, which turn on both of the two series-connected P-channel MOSFETs Q21, Q23, the output signal D0' of the NOR gate circuit G1 will be at high level such as VCH.

With the read signal D0 being at high level such as VCC and being applied to the gate of the P-channel MOSFET Q22 in the NOR gate circuit G2, the MOSFET Q22 tends to be turned on owing to a voltage VCH-VCC applied between its gate and source. However, since the P-channel MOSFET Q20 receiving at its gate an output signal D0' at high level corresponding to the boosted voltage VCH is turned off, the current path of the series-connected P-channel MOSFETs Q20, Q22 in the NOR gate circuit G2 is cut off.

The above latch circuit level-shifts a read signal D0 swinging between a low level such as the grounding voltage and a high level such as the power supply voltage to an output signal generated from the output terminal of the NOR gate circuit G1 swinging between a high level corresponding to the boosted voltage VCH and a low level such as the circuit grounding voltage.

The P- and N-channel MOSFETs Q1 and Q2 constituting the driver section DRV are supplied at their gates the output signal D0' with a high and a low voltage level corresponding to the boosted voltage level VCH and the grounding voltage level, respectively. Thus, the MOSFETs Q1 and Q2 perform a complementary switching operation to supply to the gate of the output MOSFET Q3 a drive signal D0H of a low voltage level such as the circuit grounding level and a high voltage level such as the boosted voltage.

In FIG. 1, the boosting circuit device VCHG2 is supplied with an input clock signal or an external clock pulse signal CLOCK, a command signal COMMAND, and an output enable signal DOE. When the device VCHG2 receives a command signal designating a read mode, and an output enable signal DOE, it uses the clock pulse signal clock to control the boosting operation. The reason why the DRAM shown in FIG. 1 includes the boosting circuit device operative with the clock pulse signal CLOCK and the command signal COMMAND is that the DRAM of this embodiment is a so-called synchronous dynamic RAM (SDRAM). Examples of such SDRAMs are "HM5216800/HM5241605 series" RAMs manufactured by Hitachi, Ltd.

Although not especially limited, the boosting circuit device VCHG1 for the word line driving has a level sensor 80 which senses the level of the boosted voltage such that when the sensor 80 senses a decrease in the boosted voltage, the boosting circuit device performs a boosting operation with a pulse signal formed by an oscillation circuit (not shown) built-in in the sensor 80. A boosting operation is also performed with a word line select timing signal. Thus, the boosting operation performed prior to selection of a word line beforehand prevents the voltage level of the word line from lowering due to an electric current consumption in the word line in the word line selection.

FIG. 3 is a timing chart illustrative of the basic operation of the boosting circuit device according to one embodiment of the present invention. In FIG. 3, when the boosting circuit device receives a command signal COMMAND synchronously with an external clock signal CLOCK to operate the storage device in a read mode, the input signal to the boosting circuit device changes from 0 volts to the power supply voltage VCC synchronously with the external clock signal. Thus, the boosting circuit device performs a pre-pumping operation prior to a data output operation.

Figure 4:
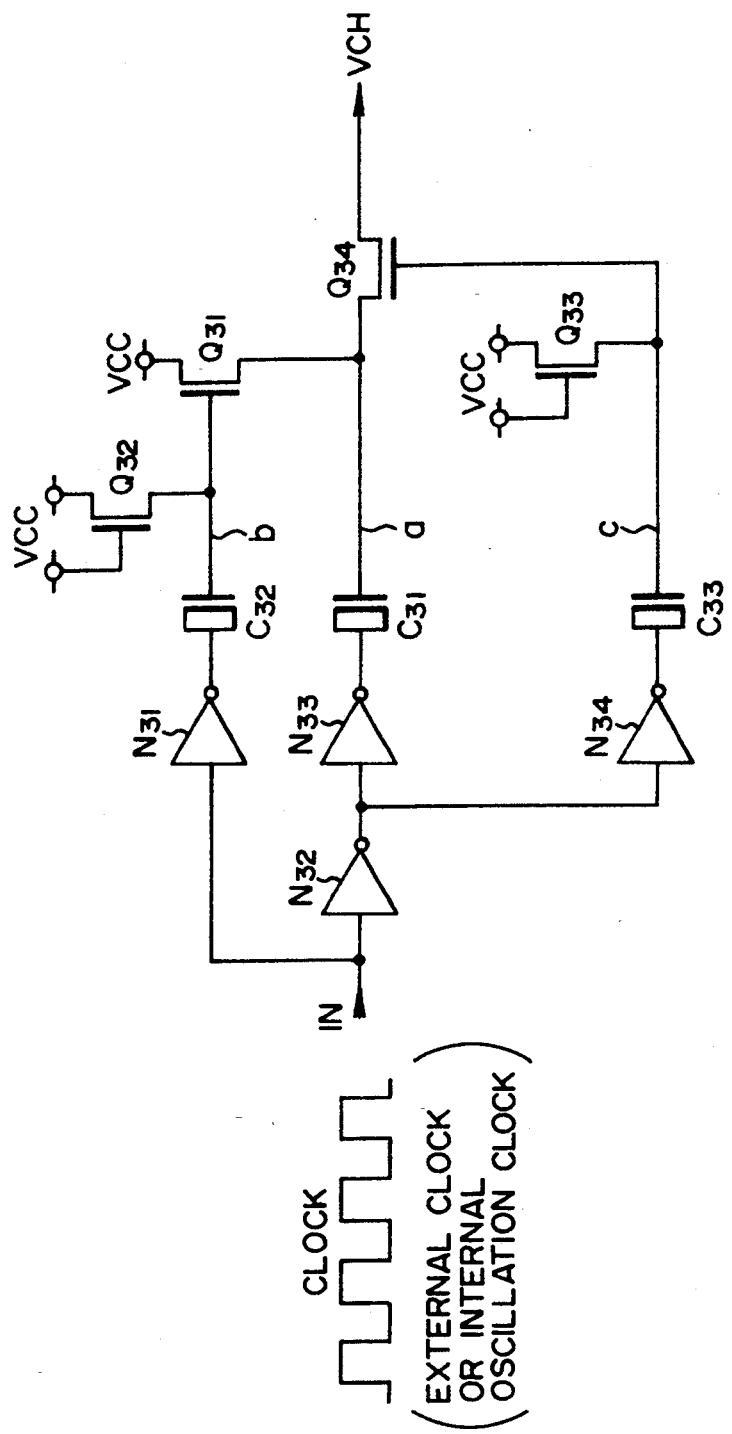
FIG. 4 is a diagram of an illustrative pumping circuit for use with a boosting circuit device according to one embodiment of the invention.

FIG. 4 shows an illustrative pumping circuit which may be used in the boosting circuit device according to one embodiment of the present invention.

In this embodiment, control pulse voltages fed to the gates of MOSFETs Q31 and Q34 which perform a pumping operation are boosted by their associated capacitors C32 and C33 in order that a sufficient boosted voltage is obtained even with a relatively low power supply voltage VCC. In this case, an input pulse signal IN (FIG. 3) produced on the basis of a clock signal CLOCK is fed to one electrode of the capacitor C32 through an inverter N31. The power supply voltage VCC is fed to the other electrode of the capacitor C32 through the MOSFET Q32 in a diode connection. A boosted voltage obtained from the other electrode of the capacitor C32 is used to control the switching operation of the gate voltage to the MOSFET Q31 which performs the charge pumping operation.

The input pulse signal IN is also fed to one electrode of the capacitor C33 through inverters N32 and N34. A MOSFET Q33 in a diode connection is provided between the other electrode of the capacitor C33 and the power supply voltage VCC. The boosted voltage obtained from the other electrode of the capacitor C33 is used to control the switching operation of the gate voltage to the MOSFET Q34 which performs the charge pumping operation.

The input pulse signal IN is also fed to one electrode of the charge pump capacitor C31 through the inverters N32 and N33. The other electrode of the capacitor C31 is charged up with the power supply voltage VCC through the switching MOSFET Q31. A boosted voltage is outputted through the MOSFET Q34 to charge the smoothing capacitor C (FIG. 1).

The pumping circuit of FIG. 4 operates as follows. When the input pulse signal IN is at low level, the output signal of the invertor N31 is at high level. At this time, the output signal of the invertor N34 is at low level, so that the capacitor C33 is precharged through the MOSFET Q33 in the diode connection. Although the output signal of the inverter N33 is also at low level, the MOSFETs Q34 and Q31 are substantially off. Thus, the capacitor C31 is not charged up. Strictly speaking, since a node c is put at VCC −Vth by the MOSFET Q33 in the diode connection, a node a of the capacitor C31 is charged up to VCC −2Vth through the MOSFET Q34. However, when the power supply voltage VCC is at a low voltage such as about 3.3 volts, the charged-up voltage of the capacitor C31 is a low voltage less than 1 volt.

Thus, although the input signal IN changes from low level to high level, the boosted voltage VCH obtained by the capacitor C31 does not reach a predetermined voltage. This implies that no charge pumping operation will be performed even when the high level of the inverter N34 boosts the voltage at the node c of the capacitor C33 to turn on the MOSFET Q34.

The change of the input signal IN to the high level changes the output signal of the inverter N31 to a low level to thereby charge up the capacitor C32 through the MOSFET Q32 in the diode connection. Since the capacitor C32 has been charged up as described, when the input pulse signal IN returns to the low level, the MOSFET Q31 is turned on by the boosting operation of the capacitor C32 such that the MOSFET Q31 is charged up to the power supply voltage VCC. That is, the pre-pumping operation is performed such that the capacitor C32 is charged up by a high level voltage at a rise of the first pulse of the input signal IN and the capacitor C31 is charged up by a low level voltage at a fall of the first pulse of the input signal.

In the timing chart of FIG. 3, the pre-pumping operation is intended to charge up the capacitors C32 and C31 of the pumping circuit as described above. Owing to the pre-pumping, when the data D0–D3 actually read synchronously with the clock signal CLOCK is outputted with a pre-pumping operation performed synchronously with the data outputting, a decrease in the boosed voltage VCH caused by the operation of the data output circuit is compensated for i.e., the smoothing capacitor is charged up each time the data output circuit is operated. As a result, the boosted voltage VCH can be maintained at the desired high voltage level.

When data is read in the unit of 8 bits, as mentioned above, the eight data output circuits DOC1–DOC8 operate simultaneously. Thus, a relatively large drive current is consumed to lower the boosted voltage VCH. Thus, the pumping operation synchronized with the read operation causes data D0–D3 to be outputted in a serial manner from one input/output terminal I/O at the same voltage level and with the same output current.

Figure 5:
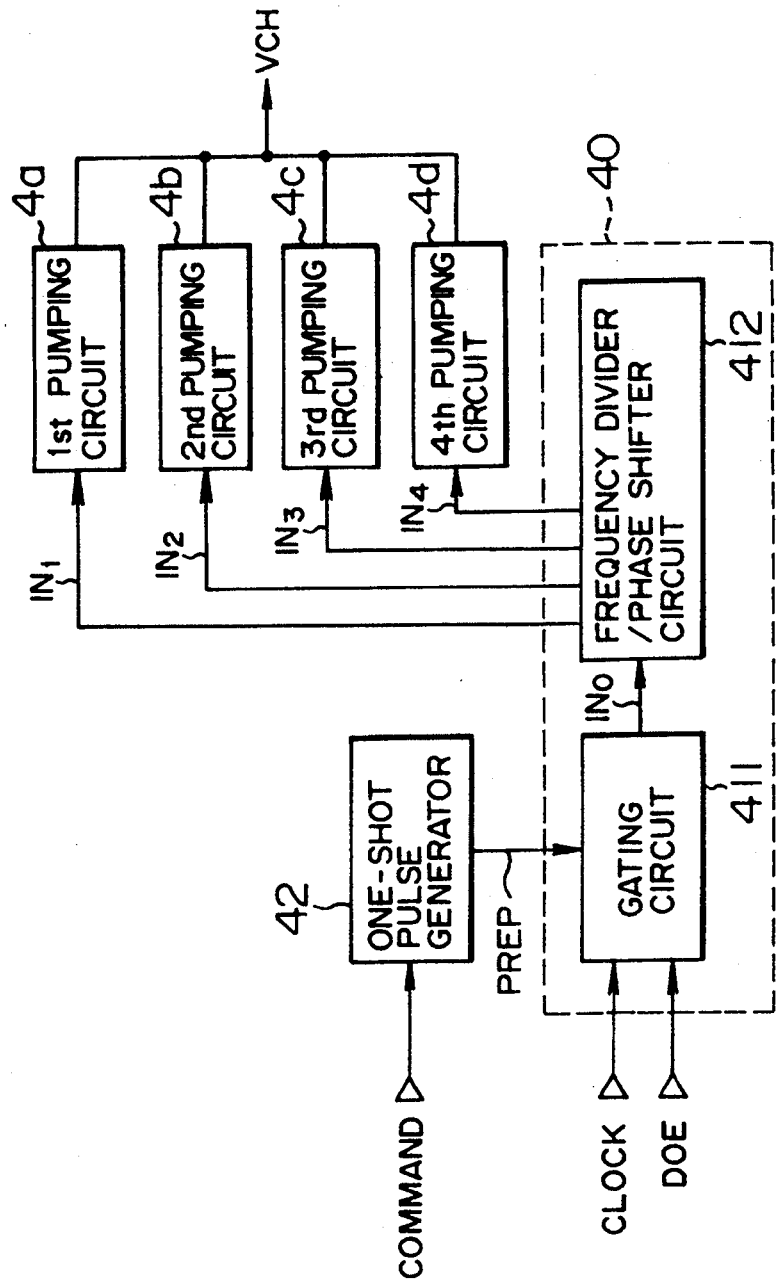
FIG. 5 is a diagrammatic block diagram of a boosting circuit device according to one embodiment of the invention.

FIG. 5 is a block diagram of a boosting circuit device according to one embodiment of the present invention. In this embodiment, the boosting circuit device includes a plurality of (for example, four) pumping circuits (for example, 4a–4d), a control circuit 40 and a one-shot pulse generator 42. The outputs of the four pumping circuits are connected together in common to the smoothing capacitor C. The one-shot pulse generator 42 generates a single pulse in response to a command signal COMMAND for setting a read mode received synchronously with an external clock. The control circuit 40 includes a gating circuit 411 and a frequency divider/phase shifter circuit 412 to be described in detail later.

Figure 6:
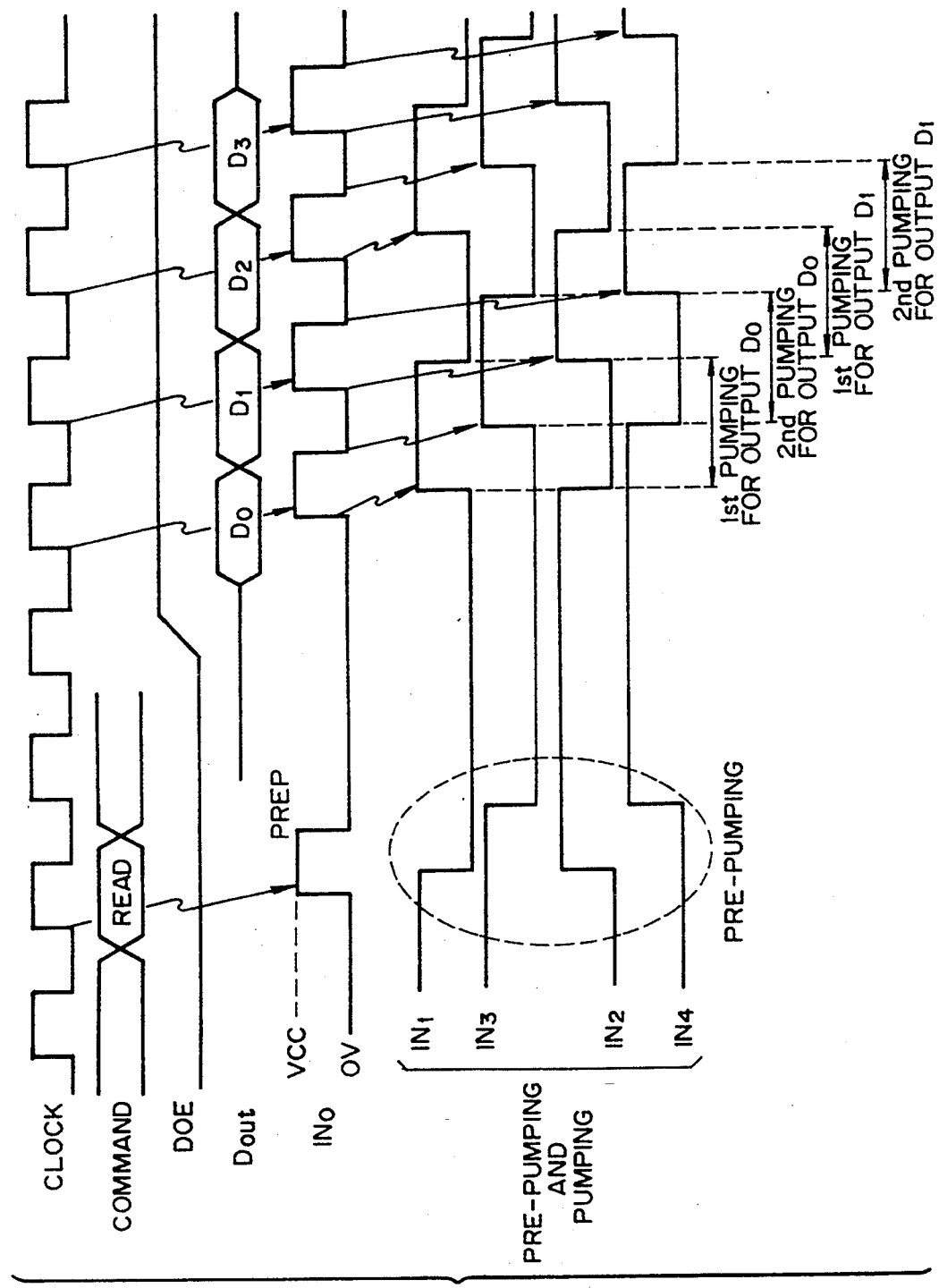
FIG. 6 is a timing chart illustrative of the operation of the boosting circuit device of FIG. 5.

FIG. 6 is a timing chart indicative of an illustrative operation of the boosting circuit device shown in FIG. 5. The frequency divider/phase shifter circuit 412 of the control circuit 40 divides by two the frequency of a control pulse signal IN0 received through the gating circuit 411 and converts the frequency divided signals to four phase pulse signals differing in phase from one another by a half period of the divided pulse signals. In other words, the frequency-divided input pulse signals differ sequentially by $\pi/2$ in phase.

When a command signal COMMAND introduced with a rise edge of an external clock signal CLOCK is intended to set a read mode, the one-shot pulse generator 42 responds to the command signal (preliminary input signal) to generate one pulse PREP to perform the pre-pumping operation. The pulse PREP is fed as a basic control pulse signal IN0 to the frequency divider/phase shifter circuit 412 through a NOR gate (NOG) of the gating circuit 411. In response to the signal IN0 changing from a low level to a high level, an input signal IN1 to the first pumping circuit 4a changes from high level to low level and an input signal IN2 to the second pumping circuit 4b changes from a low level to a high level. In response to the signal IN1 changing from the high level to the low level, an input signal IN3 to the third pumping circuit 4c changes from a high level to a low level, and an input signal IN4 to the fourth pumping circuit 4d changes from a low level to a high level.

When the read data D0–D3 are actually outputted in a serial manner synchronously with the external clock signal CLOCK, the first pumping circuit 4a outputs a boosted voltage synchronously with a rise of the input signal IN0 while the pumping circuit 4c outputs a boosted voltage synchronously with a fall of the input signal IN0. Since the pumping interval of time is doubled and the frequency divided signals are sequentially shifted by a $\pi/2$ in phase to perform the pumping operations, as mentioned above, the pumping operation for one data D0 is performed twice by the first and third pumping circuits 4a and 4c. Similarly, the pumping operation for one data D1 is performed twice by the second and fourth pumping circuits 4b and 4d. The pumping operation for the output of data D2 is again performed twice by the first and third pumping circuits 4a and 4c while the pumping operation for the output of data D3 is performed twice by the second and fourth pumping circuits 4b and 4d.

Such elaborate pumping operations further suppress a decrease in the boosted voltage VCH to provide a further stabilized boosted voltage. This provides a further stabilized output level and a further stabilized output current.

Figure 7:
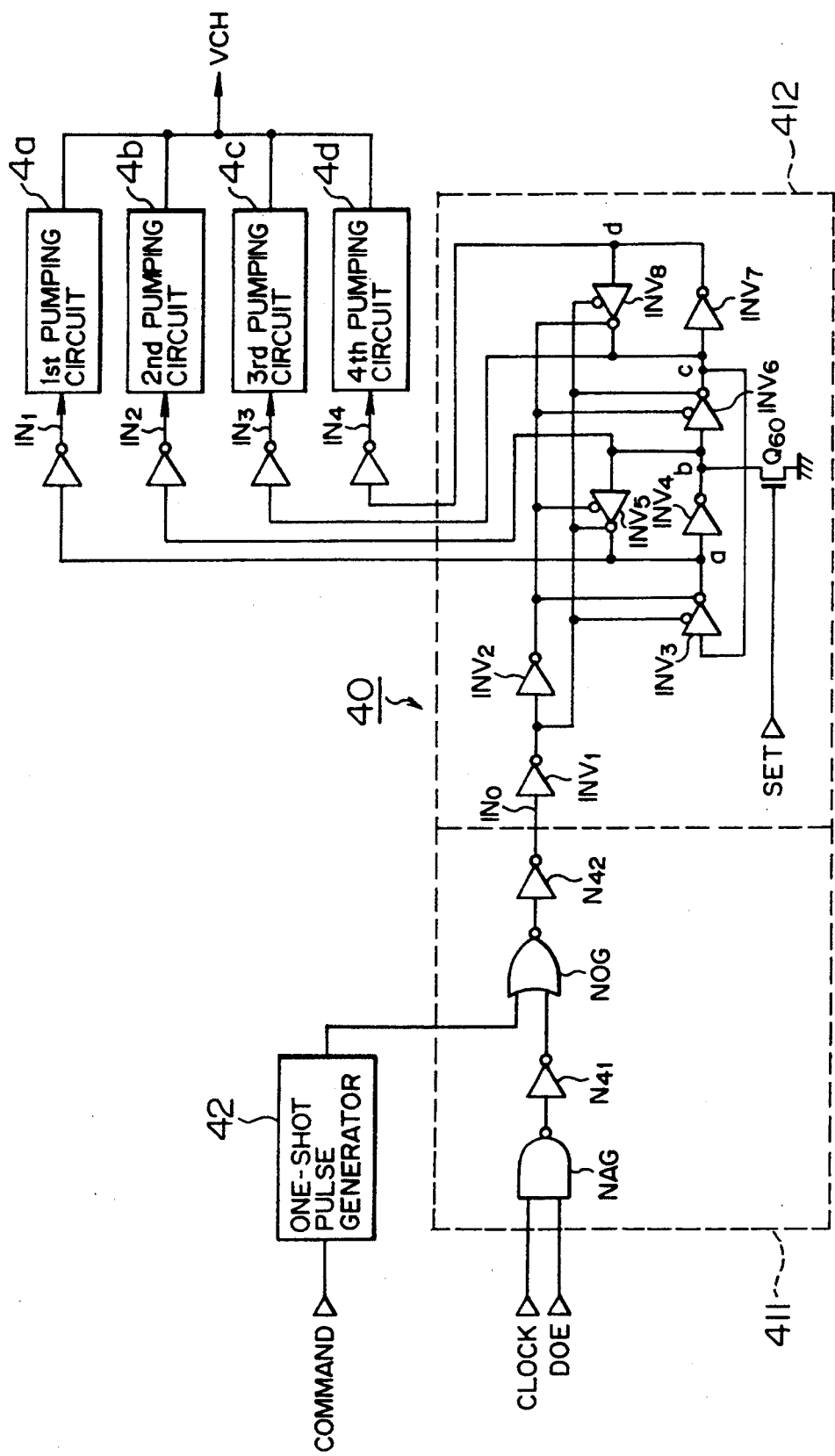
FIG. 7 is a circuit diagram of a specific example of the embodiment of FIG. 5.

FIG. 7 shows one illustrative specific circuit diagram of the control circuit 40 of the embodiment of FIG. 5. A one-shot pulse generator 42 is supplied with a read command signal COMMAND such as is mentioned above while a gating circuit 411 is supplied with a clock signal CLOCK and an output enable signal DOE.

First, the one shot pulse generator 42 generates a single pulse PREP in response to a read command signal COMMAND received synchronously with an external or input clock signal CLOCK. The pulse PREP is then fed through a NOR gate NOG of the gating circuit 411 and the frequency divider/phase shifter circuit 412 to first-fourth pumping circuits 4a–4d to perform the pre-pumping operation illustrated with respect to FIG. 6.

After the pre-pumping operation, a NAND gate circuit NAG is opened by a data output enable signal DOE. The timing at which the signal DOE is generated is controlled in accordance with a predetermined mode (called "latency") to introduce the input clock signal CLOCK through the NAND gate circuit NAG when a data output is effected so that the first to fourth pumping circuits 4a–4d are operated sequentially and synchronously with the data output so as to compensate for a decrease in the boosted voltage consumed for the data outputting. The output of the NAND gate NAG is inputted as a control pulse signal IN0 to the frequency divider/phase shifter circuit 412 through the inverter N41, NOR gate NOG, and inverter N42. In the operation illustrated in FIG. 3, the "latency" is set for 3 cycles of the clock signal CLOCK.

A set pulse SET generated when the power supply for the DRAM is turned on is applied to the MOSFET Q60 to thereby set each of the nodes of the frequency divider/phase shifter circuit 412 at its initial voltage value. The circuit 412 includes a CMOS inverter INV1 which receives an input signal IN0, a COMS inverter INV2 which receives the output of the inverter INV1 and two flip-flops. One of the flip-flop includes a clocked inverter INV3, a COMS inverter IN4 which receives the output of the clocked inverter INV3 and a clocked inverter INV5 for feeding back the output signal of the CMOS inverter IN4 to its input terminal, and the other includes a clocked inverter INV6, a COMS inverter IN7 which receives the output of the clocked inverter INV6 and a clocked inverter INV8 for feeding back the output signal of the CMOS inverter IN7 to its input terminal. The output signal of the clocked inverter INV6 is fed to the CMOS inverter INV7 and the clocked inverter IN3 to form a binary counter (a frequency divider).

When the frequency divider/phase shifter circuit 412 is in an inoperative state, with the control pulse signal IN0 being at low level, the clocked inverters INV3 and INV8 are in an off state. The set pulse turns on the MOSFET Q60 for a predetermined interval of time to set the node b at low level. Since the inverters INV5 and INV6 are in an on state, the nodes a and c are at high level while the node b is at low level.

The pulse signal IN0 received through the gating circuit 411 selectively operate the clocked inverters INV3, INV5, INV6 and INV8 through the two inverters INV1 and INV2. When the level of the input signal IN0 changes from "low" to "high", the inverter INV3 is turned on while the inverters INV5 and INV6 are turned off. Thus, the node a changes from "high" to "low" while the node b is changed reversely from "low" to "high". (The nodes c and d remain unchanged.) When the level of the input signal IN0 changes from "high" to "low", the inverters INV5 and INV6 are turned on while the inverters INV3 and INV8 are turned off. Thus, the node c changes from "high" to "low" while the node d is changed reversely from "low" to "high". (The nodes a and b remain unchanged.) Thereafter, by iteration of similar operations, four different phase shifted clock signals sequentially shifted by a $\pi/2$ in phase and having a period which is equal to twice that of the input signal IN0 are obtained at the corresponding nodes a to c. The first to fourth pumping circuits 4a–4d may have the same structure as shown in FIG. 4.

Figure 8:
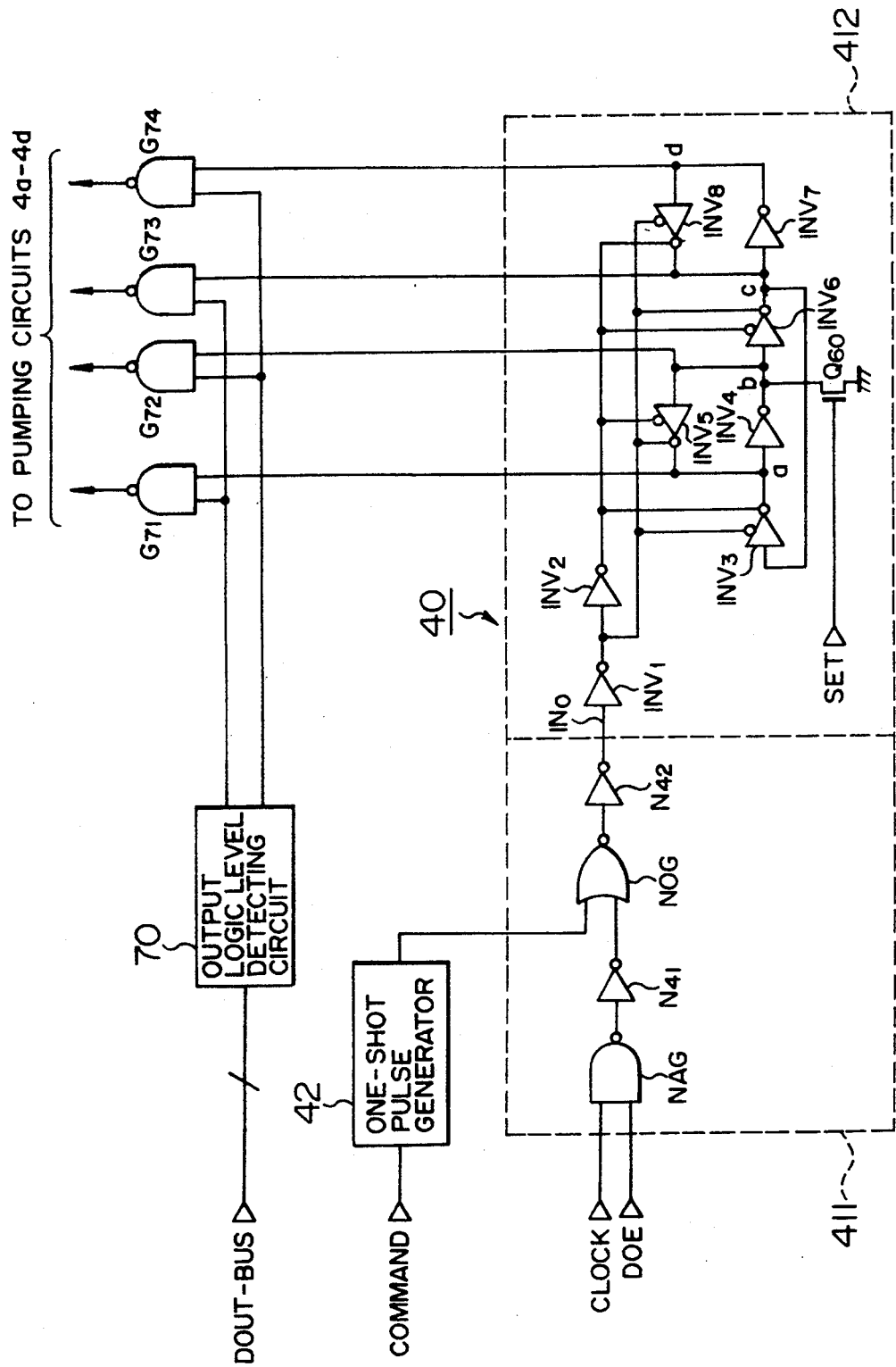
FIG. 8 is a circuit diagram of a boosting circuit device according to one embodiment of the invention.

FIG. 8 is a circuit diagram of a boosting circuit device as another embodiment of the present invention. In this embodiment, an output logic level detecting circuit 70 is provided which outputs a signal to control NAND gate circuits G71–G74 and hence the outputting of four pulse signals produced by the frequency divider/phase shifter circuit 412.

The output logic level detecting circuit 70 detects logic levels of a plurality of simultaneously outputted data, for example, eight data in the structure shown in FIG. 1 to control the NAND gate circuits G71–G74 on the basis of the detection result.

For example, when the circuit 70 detects that the first bit data (D0) of all of the simultaneously outputted eight data are all at low level, the gate circuits G71 and G73 are closed by an output of the circuit 70 so that input signal IN1 to the first charge pumping circuit 4a and input signal IN3 to the third charge pumping circuit 4c (FIG. 6) are kept unchanged and pumping for the first bit is never effected. Meanwhile, when the circuit 70 detects that the second bit data (D1) of all of the simultaneously outputted eight data are all at low level, the gate circuits G72 and G74 are closed by an output of the circuit 70 so that input signal IN2 to the second charge pumping circuit 4b and input signal IN4 to the fourth charge pumping circuit 4d (FIG. 6) are kept unchanged and pumping for the second bit is never effected. In this manner, the power consumption in the charge pumping circuits 4a to 4d can be minimized.

Figure 9:
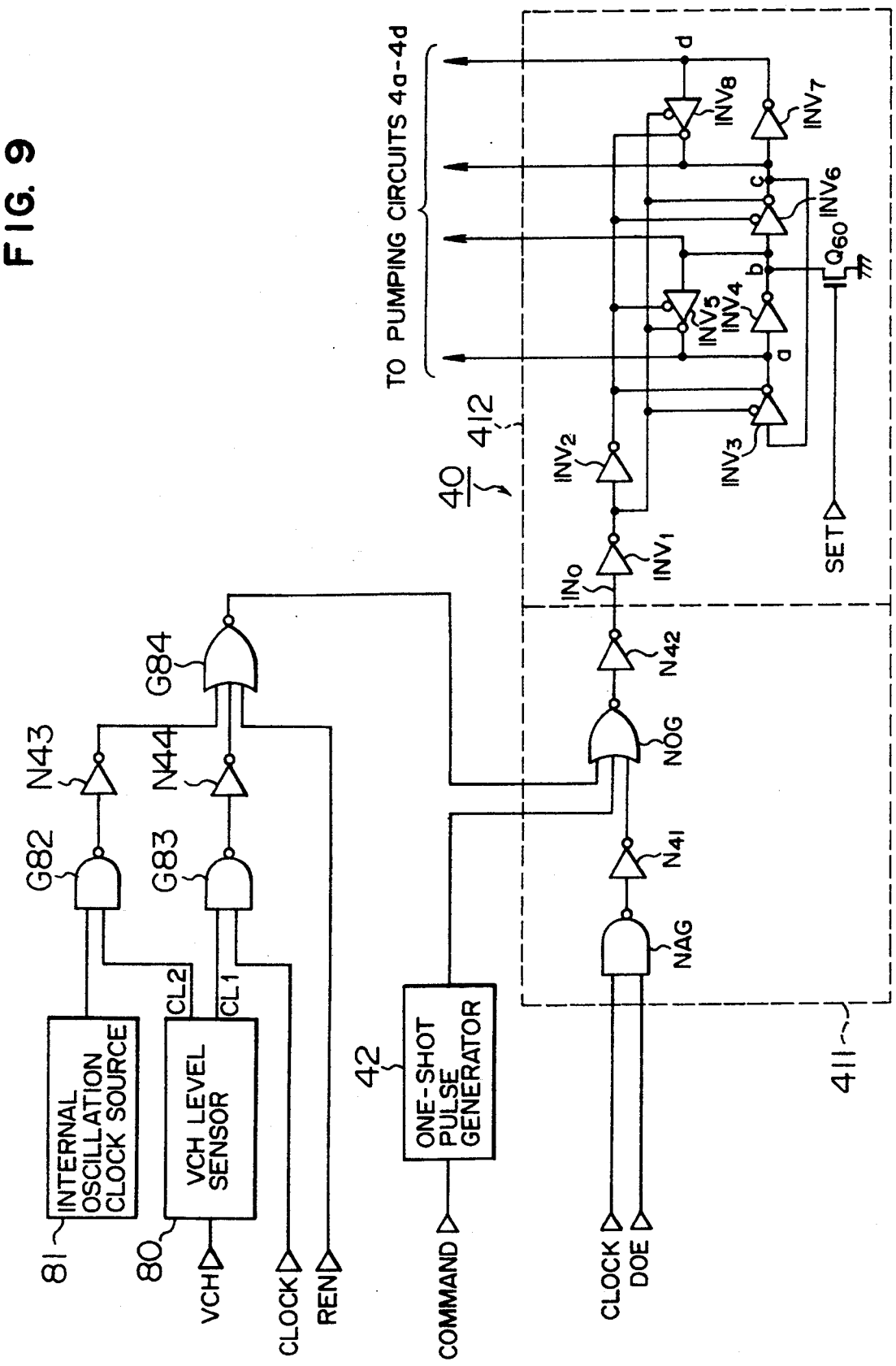
FIG. 9 is a circuit diagram of a boosting circuit device according to one embodiment of the invention.

FIG. 9 is a circuit diagram of a boosting circuit device according to still another embodiment of the present invention. In this embodiment, the two boosting circuit devices VCHG1 and VCHG2 of FIG. 1 are replaced with a single common circuit.

Thus, in the gating circuit 411, a signal for actuating the pumping circuits 4a–4d is fed, with a timing for a turn-on of a power switch or with a timing for a supply of the boosted voltage VCH for selection of a word line, to the NOR gate circuit NOG which serves to supply an input signal to the inverter N42 operative to generate the input pulse signal IN0 for effecting the above-mentioned pre-pumping.

The VCH level sensor 80 is capable of sensing the voltage level of the boosted voltage VCH and producing first and second sense signals CL1 and CL2, the first sense signal CL1 being representative of the boosted voltage VCH lower than a first voltage level, the second sense signal CL2 being representative of the boosted voltage VCH lower than a second voltage level and not lower than the first voltage level. For example, when the power switch is turned on, since the voltage VCH is a the ground voltage level, NAND gate circuit G83 is opened by the first sense signal CL1 to introduce external clock pulses (CLOCK) via the NAND gate circuit G83, inverter circuit N44 and NOR gate circuit G84 until the voltage VCH is boosted up to the first voltage level, for example, 4 V. When the voltage VCH exceeds the first voltage level, NAND gate circuit G82 is opened by the second sense signal CL2 is to introduce clock pulses having a relatively long period from the internal oscillation clock source 81 via the NAND gate circuit G82, inverter circuit N43 and the NOR gate circuit G84 until the voltage VCH is boosted up to the second voltage level, for example, 4.5 V.

Further, one-shot pulse REN generated with a timing for a supply of the boosted voltage VCH for selection of a word line is introduced via the NOR gate circuit G84.

By this structure, the pumping is effected, whenever necessary, in addition to the case of a data output operation, by supplying the above-mentioned signal via the gate circuit G84 to the NOR gate circuit NOG in the gating circuit 411, whereby the boosted voltage is kept at a substantially constant level. The embodiment shown in FIG. 9 is effective in simplification of the circuit structure of the control circuit and the pumping circuit, owing to the common use of the boosting circuit device.

Figure 10:
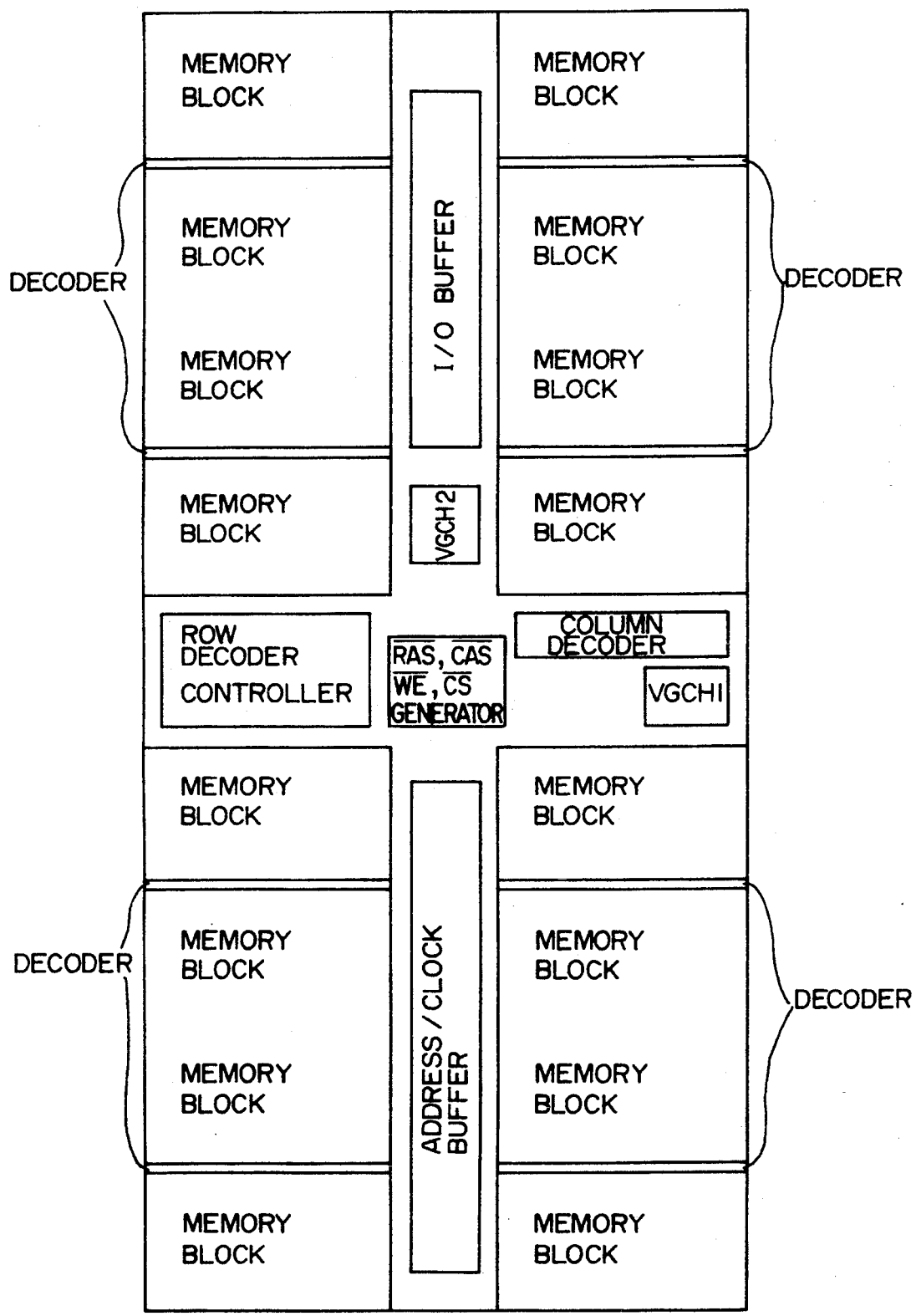
FIG. 10 is a schematic of a DRAM according to one embodiment of the present invention.

FIG. 10 shows an illustrative structure of a DRAM according to one embodiment of the present invention. The respective circuits shown in FIG. 10 are formed on a single semiconductor substrate, for example, of single crystal silicon, using known semiconductor integration techniques. FIG. 10 shows an example of the actual geometric layout of the respective circuit blocks on the semiconductor chip. Throughout the description, the term "MOSFET" implies an insulated gate field effect transistor (IGFET).

In order to prevent a decrease in the operative speed of the RAM caused by increases in the lengths of wiring conductors for the control signals and memory array drive signals due to increases in the memory capacity and hence the chip size, the layout of the memory arrays which constitute the RAM and peripheral circuits which select an address in the memory array, etc., is contrived as follows.

In FIG. 10, a cross-shaped area which includes a vertical and a horizontal central stripe portion is provided on a chip. The peripheral circuits are mainly disposed on the cross-shaped area. The memory arrays are disposed in the four divided areas of the chip by the cross-shaped area. That is, the cross-shaped area is provided at the vertical and horizontal central stripe portions of the chip such that the memory arrays are provided in the four areas of the chip divided by the cross-shaped area. Although not especially limited, the four memory arrays have a storage capacity of about 4 Mbits each and hence a large memory capacity of about 16 Mbits in all.

Each memory array includes 4 memory blocks in which word lines extend in the horizontal direction and pairs of complementary bit lines (data or digit lines) extend in the vertical direction. One memory block has a memory capacity of about 1 Mbit. Each of the four memory blocks in each memory array has a word line driver (not shown) arranged at its side portion facing the vertical central stripe portion.

A row decoder and a controller are provided in the left-hand central portion of the cross-shaped area while a column decoder and a first boosting circuit device VCHG1 for word line boosting are provided in the right-hand central portion of the cross-shaped area.

An input/output buffer and an input/output pin I/O are disposed in the upper central portion of the cross-shaped area. A second boosting circuit device VCHG2 for boosting a data output buffer is provided below the input/output buffer.

Input buffers, the corresponding address pins and clock pins are provided below the lower central portion of the cross-shaped area. Although not especially limited, units which generate other control signals RASB, CASB, WEB and CSB are disposed in the central portion of the cross-shaped area in the vicinity of the controller.

Figure 11:
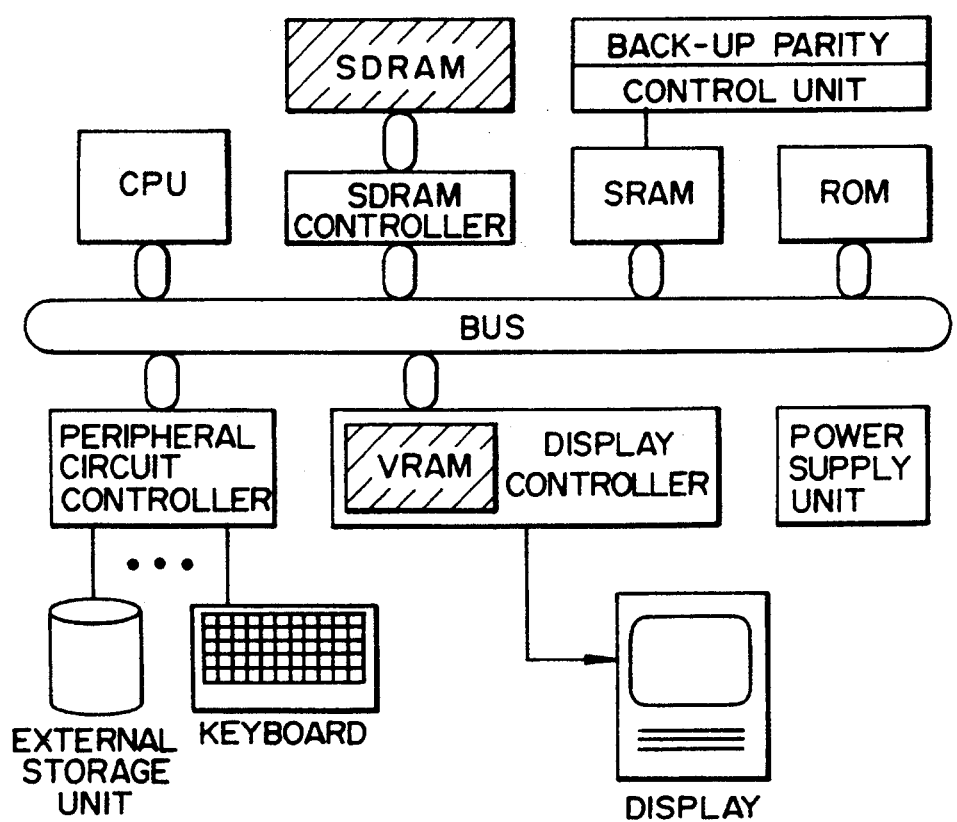
FIG. 11 is a diagrammatic view of the essential portion of a SDRAM according to one embodiment of the present invention.

FIG. 11 is a schematic diagram of the essential portion of a computer system to which a SDRAM (Synchronous DRAM) according to one embodiment of the present invention is applied. The computer system includes a bus, a central processing unit CPU, a peripheral circuit controller, a SDRAM as a main memory, its controller, a SRAM as a back-up memory, a back-up parity, its control unit, a ROM which stores a program, a display system, etc.

The peripheral circuit controller is connected to an external storage unit, a keyboard KB, etc. The display system includes a VRAM (video RAM), etc., and a display as an output device to display information stored in the VRAM. A power supply is provided which feeds power to the internal circuits of the computer system. The CPU generates signals to control the operation timings of the respective memories. While the example of the SDRAM as the main memory to which the present invention is applied has been described, the present invention may be applied to a serial access section of the VRAM of the display system if the VRAM of the display system is of the multiport type.

When a SDRAM is mounted on an information processing system such as a computer system as in the above embodiment, miniaturization and increased performance are expected due to an increased integration degree, enlarged capacity, increased operation speed and/or reduced power consumption of the SDRAM. In addition to the use of the SDRAM as the main memory, the SDRAM may be used as a file memory which replaces a hard disk memory, by using a large memory capacity thereof effectively.

The advantages produced by the above embodiments are as follows:

(1) The data output circuit includes two N-channel output MOSFETs in the push-pull connection which output read data successively. The boosting circuit device includes two switching MOSFETs the switching operation of which is controlled synchronously with an input pulse signal thereto to perform the pumping operation, and a pumping circuit in which a control signal fed to the gate of at least one of those MOSFETs is boosted by a bootstrap operation. Thus, the pre-pumping operation is performed prior to the read operation to thereby form a boosted voltage for the pumping circuit properly, so that a required boosted voltage to be supplied to the data output circuit is obtained by the pumping operation synchronized with the actual read operation (see FIG. 4, for example).

(2) The boosting circuit device is applied to a memory having the functions of introducing a command signal which designates an operation mode synchronously with an external input clock pulse signal, and outputting serially read signals indicative of data read in the unit of bits from the memory array in order to output data serially at high speed in a stabilized manner.

(3) A pumping circuit with a plurality of parallel connected output terminals is used to frequency divide the input pulse signal into a plurality of pulse signals differing in phase from one another to thereby perform a pumping operation on one data output twice in order to stabilize the boosted voltage (see FIG. 7, for example).

(4) The smoothing capacitor connected to the output terminal of the pumping circuit shares an output terminal with the boosting circuit device which forms a word line selection voltage to reduce the chip area (see FIG. 1, for example).

(5) The logic level of data to be outputted is sensed to stop the delivery of the input clock pulse to the pumping circuit when the outputting of a low level signal is sensed to reduce the power consumption (see FIG. 8, for example).

(6) Application of the boosting circuit device to a memory which uses a low operating power supply voltage such as about 3 volts serves to form a stabilized boosted voltage efficiently to thereby provide a satisfactory output level and a satisfactory output current.

(7) When a single boosting circuit device has a dual function of generating a boosted voltage to be supplied to a word line driver and generating a boosted voltage to be supplied to a data output circuit, it is possible to reduce the chip area (see FIG. 9, for example).

While the present invention has been described specifically in terms of the preferred embodiments thereof, the present invention is not limited to those embodiments. Many changes and modifications may be possible without departing from the spirit of the invention, of course. For example, in FIG. 2A, any circuit may be used as the level shifter section as long as the circuit is capable of converting the VCC level to the VCH level, apart from the level shifter section in the form of a latch having a pair of NOR gates, as described above. The driver circuit section may have a gating function which turns off the output MOSFET Q3 in accordance with an output enable signal, apart from the CMOS inverter.

The DRAM may have the function of outputting data for one word line in a serial manner. Also, in this case, the pumping operation is performed to prevent a decrease in the boosted voltage each time data is outputted synchronously with the clock signal.

The present invention is widely applicable to semiconductor storages which include an output circuit for delivering an output signal in accordance with a drive signal produced from the boosting circuit device.

I claim:

1. A boosting circuit device comprising:
    pumping circuit means operable with a first electric power at a first voltage and responsive to a control clock signal for supplying a second electric power at a second voltage boosted higher than the first voltage of said first electric power;
    a one-shot pulse generator responsive to a preliminary input signal for generating a single pulse; and
    a control circuit responsive to said single pulse and an input clock signal for generating said control clock signal, said preliminary input signal being generated in synchronization with said input clock signal, said control clock signal containing a pre-pumping pulse corresponding to said single pulse and a plurality of clock pulses corresponding to said input clock signal and following said pre-pumping pulse.

2. A boosting circuit device according to claim 1, wherein:
    said pumping circuit means includes a plurality of pumping circuits having their outputs connected in common; and
    said control circuit includes a gating circuit for receiving said input clock signal externally supplied thereto and said single pulse from said one-shot pulse generator to generate a basic control clock signal, and a frequency diving/phase shifting circuit for frequency-dividing said basic control clock signal to a plurality of frequency-divided control clock signals and phase-shifting said frequency-divided control clock signals from each other, said phase-shifted and frequency-divided control clock signals each being fed to a different one of said plurality of pumping circuits.

3. A boosting circuit device for supplying an electric power at a boosted voltage to a data output circuit for outputting a logic output signal, comprising:
    pumping circuit means operable with a first electric power at a first voltage and responsive to a control clock signal for producing a second electric power at a second voltage boosted higher than the first voltage of said first electric power;
    a one-shot pulse generator responsive to a preliminary input pulse for generating a single pulse;
    a control circuit responsive to said single pulse and an input clock signal for generating said control clock signal, said preliminary input signal being produced in synchronization with said input clock signal, said control clock signal containing a pre-pumping pulse corresponding to said single pulse and a plurality of clock pulses corresponding to said input clock signal and following said pre-pumping pulse; and
    a level detecting circuit for detecting logic level of said logic output signal; and
    a gate circuit provided between said control circuit and said pumping circuit means, an output of said level detecting circuit being supplied to said gate circuit to selectively transfer said control clock signal to said pumping circuit means under control of said output of said level detecting circuit.

4. A dynamic RAM of the type in which data are successively read out responsive to a read command signal, comprising:
    a plurality of memory arrays each including a word line driver;
    a plurality of data output circuits for outputting logic output signals to I/O pads; and
    a boosting circuit device for supplying an electric power at a boosted voltage at least to said data output circuits, said boosting circuit device including
    pumping circuit means operable with a first electric power at a first voltage and responsive to a control clock signal for producing a second electric power at a second voltage boosted higher than the first voltage of said first electric power,
    a one-shot pulse generator responsive to a preliminary input pulse for generating a single pulse, and
    a control circuit responsive to said single pulse and an input clock signal for generating said control clock signal, said preliminary input signal being produced responsive to said read command signal in synchronization with said input clock signal, said control clock signal containing a pre-pumping pulse corresponding to said single pulse and a plurality of clock pulses corresponding to said input clock signal and following said pre-pumping pulse such that said second voltage of said second electric power has been boosted higher than the first voltage of said first electric power by said pre-pumping pulse in advance of a successive readout of data; and
    a smoothing capacitor for smoothing said second voltage of said second electric power from said boosting circuit device.

5. A dynamic RAM according to claim 4, further comprising a level sensor for detecting a level of said second voltage of said second electric power, wherein said boosting circuit device serving to supply said second electric power at a boosted voltage to said data output circuits and to said word line drivers, said level sensor serving to generate, when said level of said second voltage of said second electric power is decreased below a predetermined level, a sense signal to be applied to said control circuit of said boosting circuit device for controlling said pumping circuit means.

* * * * *